United States Patent
Funaki

(10) Patent No.: US 7,241,638 B2
(45) Date of Patent: Jul. 10, 2007

(54) MICROMECHANICAL DEVICE AND METHOD OF MANUFACTURE THEREOF

(75) Inventor: Hideyuki Funaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 11/155,771

(22) Filed: Jun. 20, 2005

(65) Prior Publication Data

US 2005/0231794 A1 Oct. 20, 2005

Related U.S. Application Data

(62) Division of application No. 10/806,405, filed on Mar. 23, 2004, now Pat. No. 6,940,139, which is a division of application No. 10/230,200, filed on Aug. 29, 2002, now Pat. No. 6,740,946.

(30) Foreign Application Priority Data

Aug. 30, 2001 (JP) .............................. 2001-261999

(51) Int. Cl.
*H01L 21/00* (2006.01)
*H01L 21/311* (2006.01)
(52) U.S. Cl. ............................ 438/50; 438/52; 438/700
(58) Field of Classification Search ................... 438/50, 438/52, 700
See application file for complete search history.

(56) References Cited

U.S. PATENT DOCUMENTS 5,262,000 A * 11/1993 Welbourn et al. .............. 216/2
5,880,921 A 3/1999 Tham et al.
5,969,463 A 10/1999 Tomita et al.
6,153,839 A 11/2000 Zavracky et al.
6,753,488 B2 * 6/2004 Ono et al. .................. 200/181
6,969,630 B2 * 11/2005 Ozgur ........................ 438/53

(Continued)

FOREIGN PATENT DOCUMENTS

JP 7-231103 8/1995

(Continued)

OTHER PUBLICATIONS

K. Wang, et al. "VHF Free-Free Beam High-Q Micromechanical Resonators", Technical Digest, 12th International IEEE Micro Electro Mechanical Systems Conference, Jan. 17-21, 1999, pp. 453-458.

(Continued)

*Primary Examiner*—Ngân V. Ngô
(74) *Attorney, Agent, or Firm*—Oblon, Spivak, McClelland, Maier & Neustadt, P.C.

(57) ABSTRACT

A micromechanical switch comprises a substrate, at least one pair of support members fixed to the substrate, at least one pair of beam members placed in proximity and parallel to each other above the substrate, and connected to one of the support members, respectively, each of the beam members having a moving portion which is movable with a gap with respect to the substrate, and a contact portion provided on the moving portion, and a driving electrode placed on the substrate between the pair of beam members to attract the moving portions of the beam members in a direction parallel to the substrate with electrostatic force so that the contact portions of the beam members which are opposed to each other are short-circuited.

8 Claims, 11 Drawing Sheets

U.S. PATENT DOCUMENTS

2004/0188785 A1* 9/2004 Cunningham et al. ...... 257/415
2005/0017313 A1* 1/2005 Wan ........................... 257/415

FOREIGN PATENT DOCUMENTS

JP          9-251834        9/1997

OTHER PUBLICATIONS

Paul M. Zavracky, et al., "Micromechanical Switches Fabricated Using Nickel Surface Micromachining", Journal of Micorelectromechanical Systems, vol. 6, No. 1, Mar. 1997, pp. 3-9.

* cited by examiner

MICROMECHANICAL DEVICE AND METHOD OF MANUFACTURE THEREOF

CROSS-REFERENCE TO RELATED APPLICATIONS

This application is a divisional application of U.S. patent application Ser. No. 10/806,405, filed Mar. 23, 2004, now U.S. Pat. No. 6,940,139 which is a divisional application of U.S. Pat. No. 6,740,946, filed Aug. 29, 2002, and is based upon and claims the benefit of priority from the prior Japanese Patent Application No. 2001-261999, filed Aug. 30, 2001, the entire contents of which are incorporated herein by reference.

BACKGROUND OF THE INVENTION

1. Field of the Invention

The present invention relates to a micromechanical device using surface micromachine technologies.

2. Description of the Related Art

Electrically controlled switching elements used in various electronic devices include semiconductor (solid-state) switches and reed relays. From the standpoint of an ideal relay, they have merits and demerits.

The semiconductor switches have merits of being capable of being downsized and operating at high speed and being high in reliability. They can also be easily integrated as an array of switches. For instance, PIN diodes, HEMTs (High Electron Mobility Transistors) and MOSFETs have been used as switches for switching antennas adapted for microwave, millimeter wave, etc. In comparison with switches which close or break mechanical contacts, however, the semiconductor switches are high in the on impedance and low in the off impedance and have large stray capacitance.

In comparison with the semiconductor switches, on the other hand, the reed relays are high in the on/off impedance ratio and can be designed to minimize insertion loss and ensure signal fidelity. For this reason, the reed relays have been frequently used in semiconductor testers by way of example. However, they are large in size and low in switching speed.

Recently, attention has been paid to micromechanical switches which have the merits of semiconductor switches and reed relays. Among others, micromechanical switches that are formed using surface micromachine technologies and are operated electrostatically can be implemented at low cost because they can be formed through the use of semiconductor thin-film techniques.

FIG. 1A is a plan view of a conventionally proposed micromechanical switch and FIG. 1B is a sectional view taken along line 1B—1B of FIG. 1A. This switch has a source electrode 51, a drain electrode 52, and a gate electrode 53 therebetween, which are all formed on a substrate 50 made of, say, silicon. A conductor beam 54 is formed above the gate electrode 53 with a predetermined gap therebetween. Although the electrodes are named source, drain and gate after those of MOSFETs, the switch is different in structure from the MOSFETs.

The conductor beam 54 has its one end fixed to the source electrode 51 to form an anchor portion 55. The other end of the beam is made open to form a moving contact (contact chip) 56. When a voltage is applied to the gate electrode 53, the conductor beam 54 is deflected downward by resulting electrostatic force, allowing the moving contact 56 to come into contact with the drain electrode 52. When the gate electrode 53 is deenergized, the conductor beam 54 is restored to its original position.

An analysis of deflection of the conductor beam using a mechanical model has been made by P. M. Zavracky et al. ("Micromechanical Switches Fabricated Using Nickel Surface Micromachining" Journal of Microelectromechanical Systems, Vol. 6, No. 1, March 1997). According to this analysis, when gate voltage is applied, the conductor beam 54 connected to the source electrode 51 is held in a position d(x) above the gate electrode 53 with x as the distance from the source. The gate voltage required to hold the conductor beam 54 in a deflected state increases monotonously with increasing deflection but, after it has been deflected to a certain extent or more, decreases monotonously. The system therefore becomes unstable. At some gate voltage (threshold voltage Vth), the beam bends, closing the switch.

The threshold voltage Vth according to this model is represented by $$Vth = (2/3) \times d_0 \times (2kd_0/3 \in_0 A)^{1/2}$$

where $d_0$ is the initial gap between the conductor beam and the gate electrode, k is the effective spring constant of the conductor beam, A is the area of portions of the conductor beam and the gate electrode which are opposed to each other, and $\in_0$ is the dielectric constant of air.

From this it can be seen that Vth is lowered by increasing A (increasing electrostatic force acting on the beam), reducing k, and decreasing $d_0$. However, reducing k results in a reduction in maximum switching speed and decreasing $d_0$ results in an increase in electrostatic coupling between the gate electrode and the conductor beam. Another method of lowering Vth is to increase the amount of downward projection of the moving contact 56, i.e., to decrease the gap g between the moving contact 56 and the drain electrode 52. Thereby, the switch can be closed before the unstable point is reached.

Thus, manufacturing of the gaps $d_0$ and g with precision is essential in lowering the threshold voltage Vth. The manufacture of the micromechanical switch involves complicated processes. To be specific, the source electrode 51, the drain electrode 52 and the gate electrode 53 are first formed on the substrate. A sacrificial layer of, say, silicon oxide, is then deposited on these electrodes. The sacrificial layer is subjected to two-step etch processing. In the first step, the sacrificial layer is partly etched to form the contact chip portion 56. In the second step, in order to form the anchor portion 55, the sacrificial layer is etched until the source electrode 51 is reached.

Subsequently, a conductive layer is deposited over the sacrificial layer and then patterned. Finally, the sacrificial layer is etched away in order to separate the conductor beam 54 from the substrate.

To manufacture the micromechanical switch as described above, the following four lithographic processes (masking processes) are involved:

(1) Patterning of the source electrode, etc.
(2) Patterning of the contact chip portion in the sacrificial layer
(3) Patterning of the anchor portion in the sacrificial layer
(4) Patterning of the conductive layer There has also been a proposal for use of a mechanical vibrator manufactured through similar micromachine technologies as a high-frequency filter; in fact, a bandpass filter of the order of 100 MHz has been manufactured (see C, Nguyen, et at., "VHF free-free beam high Q michromechanical resonators." Technical digest, 12th International IEEE Micro Electro Mechanical Systems Conference, 1999, pp. 453–458). The advantages of mechanical vibrator filters are that the Q value is extremely high in comparison with electrical LC filters and the size can be made extremely small in comparison with dielectric filters and SAW filters.

FIG. 2A is a plan view showing the unit configuration of such a vibrator filter and FIG. 2B is a sectional view taken along line 2B—2B of FIG. 2A. A vibrator 61, an input terminal 62 and an output terminal 63 are formed on a substrate 60 by means of micromachine technologies. The vibrator 61 is formed of polycrystalline silicon integrally with four supporting beams 64a to 64d. The supporting beams 64a to 64d have their ends fixed to the anchors 65a, 65b, and 65c, whereby the vibrator 61 is held floating above the substrate.

As with the vibrator 61, the input terminal 62 is formed from a film of polycrystalline silicon. The underlying metal is extended so that its one end is located just below the vibrator, forming a gate electrode (driving electrode) 66. The output terminal 63 and the vibrator 61 are formed on a common metal electrode 67. In practice, a mechanical filter with a given passband is manufactured by connecting a plurality of such unit vibrator filters in parallel with one another.

The vibrator 61 is driven by the driving electrode 66 to vibrate in an up-and-down direction. The resonant frequency $f_0$ of the vibrator 61 is represented by $f_0 = (1/2\pi) T(k/m)^{1/2}$ where k is the spring constant of the vibrator and m is the mass of the vibrator. With the structure and dimensions in FIGS. 2A and 2B, since $k = 3Eh^3b/l^3$ and $m = \rho Lwh$, $f_0 = (1/\pi)(Eh^2b/\rho Lwl^3)^{1/2}$ where E is the young's modulus of the vibrator and $\rho$ is the density.

For silicon, $E = 1.7 \times 10^{11}$ Pa and $\rho = 2.33 \times 10^3$ kgm$^{-3}$.

In a typical case with L=13.1 μm, l=10.4 μm, w=6 μm, h=2 μm and b=1 μm, $f_0$=92 MHz.

With portable terminals, use is made of a frequency band of 800 MHz to 5 GHz. For such applications, it is desirable to use mechanical filters which are adapted for higher frequencies than conventional ones. FIG. 3 shows the configuration of such a high-frequency receiver, which includes a bandpass filter 171, a low-noise amplifier 172, a bandpass filter 173, and a mixer 174. The mixer 174 is controlled by a phase control circuit 175 having a PLL (Phase-Locked Loop)/VCO (Voltage Controlled Oscillator). It is also desirable to use mechanical filters for the bandpass filters 171 and 173 and the PLL/VCO in the phase control circuit 175.

In order to implement a high-frequency version of the filter shown in FIGS. 2A and 2B, one might suggest increasing h, increasing b and/or decreasing L and/or l. However, this is not easy with current semiconductor processes. The structure and processes are also complicated.

As described above, the micromechanical switch proposed so far is complicated in manufacturing process and difficult to lower the threshold voltage. In particular, it is difficult to lower the threshold voltage because the contact-to-contact spacing (gap) g depends on the thickness of the sacrificial layer and the amount by which it is etched. The conventional micromechanical vibrator is also complicated in both structure and process and difficult to make a high-frequency version thereof.

For this reason, there has been a demand for a micromechanical device which is allowed to have a high performance characteristic with simple structure and a method of manufacture thereof.

BRIEF SUMMARY OF THE INVENTION

According to a first aspect of the present invention, there is provided a micromechanical switch comprising: a substrate; at least one pair of support members fixed to the substrate; at least one pair of beam members placed in proximity and parallel to each other above the substrate, and connected to one of the support members, respectively, each of the beam members having a moving portion which is movable with a gap with respect to the substrate, and a contact portion provided on the moving portion; and a driving electrode placed on the substrate between the pair of beam members to attract the moving portions of the beam members in a direction parallel to the substrate with electrostatic force so that the contact portions of the beam members which are opposed to each other are short-circuited.

According to a second aspect of the present invention, there is provided a vibrator filter comprising: a substrate; an input terminal electrode and an output terminal electrode formed on the substrate with a predetermined spacing therebetween and each having a side face; and a vibrator formed on the substrate between the input terminal electrode and the output terminal electrode, the vibrator having a moving portion with at least two side faces one of which is opposed to the side face of the input terminal electrode and another of which is opposed to the side face of the output terminal electrode, with a small gap respectively, and a pillar fixed to the substrate to support the moving portion.

According to a third aspect of the present invention, there is provided a method of manufacturing a micromechanical switch comprising: forming a sacrificial layer over a surface of a substrate; forming a polysilicon layer on the sacrificial layer; selectively etching the polysilicon layer to form a pair of beam members placed in proximity to each other and a driving electrode placed between the beam members, each of the beam members having a fixing portion configured to fix at least one end thereof to the substrate and a moving portion extending from the fixing portion; forming a metal or metal compound layer so as to cover the beam members and the driving electrode; selectively etching the metal or metal compound layer so that the metal or metal compound layer is left on the beam members and the driving electrode; and etching away the sacrificial layer existing at least under the moving portion of each of the beam members.

According to a fourth aspect of the present invention, there is provided a method of manufacturing a vibrator filter comprising: forming a sacrificial layer over a surface of a substrate to have a first, a second and a third opening; depositing a conductor layer on the sacrificial layer; patterning the conductor layer to form an input terminal electrode, an output terminal electrode, and a vibrator having a moving portion with at least two side faces and a pillar, the input terminal electrode and the output terminal electrode being placed with a predetermined spacing therebetween and fixed to the substrate through the first and the second opening, and the vibrator being placed between the input terminal electrode and the output terminal electrode so that one of the side faces of the moving portion is opposed to a side of the input terminal electrode and another of the side faces is opposed to a side of the output terminal electrode, with a small gap respectively, and is held above the substrate by the pillar formed in the third opening; and removing the sacrificial layer.

BRIEF DESCRIPTION OF THE SEVERAL VIEWS OF THE DRAWING

FIGS. 8A and 8B through FIGS. 13A and 13B are sectional views, in the order of steps of manufacture, of the micro relay of FIG. 4, the figures with suffix A corresponding to the sectional view of FIG. 5 and the figures with suffix B corresponding to the sectional view of FIG. 6;

DETAILED DESCRIPTION OF THE INVENTION

Figure 1A:
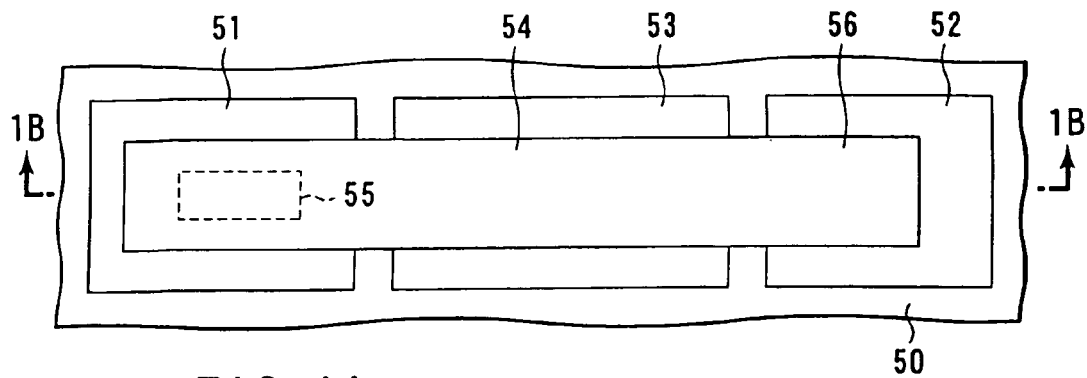
FIG. 1A is a plan view of a conventional micromechanical switch.

The embodiments will be described hereinafter with reference to the accompanying drawings.

FIRST EMBODIMENT

A micromechanical switch according to a first embodiment is formed, as shown in FIGS. 4 to 7, on the surface of a silicon substrate 10 through surface micromachine technologies. Beams 20 are formed to be fixed at both ends to the substrate 10 by anchor portions (fixing portions) 12 and, in other portions than the both ends, float above the substrate 10. The floating portion of each of the beams forms a moving portion 11. In this example, although three beams are placed in parallel with one another, a lot of beams may be arranged repeatedly; however, the switch is required only to have at least one pair of beams.

In the central portion in the direction of length of each beam, a moving contact 13 is formed. In this example, two driving electrodes (gate electrodes) 14 are placed fixed to the substrate 10 between respective beams. The beams 20, each of which comprises the moving portion 11, the anchor portion 12 and the moving contact 13 which are integral with one another, and the driving electrodes 14, which are separated from the beams, are each patterned as a stacked structure of a polysilicon layer 21 and an overlying metal layer 22.

Openings 23 in the moving contact 13 are formed through the metal layer 22 and the polysilicon layer 21 and, as will be described later, are used to etch away a sacrificial layer formed as an underlying layer of the moving contact 13 in an efficient manner. That is, since the moving contact 13 is larger in area than the moving portion 11, it takes long to remove the underlying sacrificial layer through lateral etching. In order to reduce the time required to etch away the sacrificial layer, therefore, etching through the openings 23 is used.

In such a configuration, when a gate voltage is applied to a specific driving electrode 14 with the anchor portions 12 at a reference potential, the paired moving portions 11 which are opposed to each other with that driving electrode interposed therebetween are attracted to each other by resulting electrostatic force, causing the moving contacts 13 to displace laterally and consequently come into contact with each other. In this case, since the paired moving portions 11 are displaced so as to be attracted to each other, even if the gap d0 between the moving portion 11 and the driving electrode 14 is set smaller than the gap g between the adjacent moving contacts 13, the moving contacts 13 are allowed to come into contact with each other without bringing the moving portion 11 and the driving electrode 14 into contact with each other.

Figure 1B:
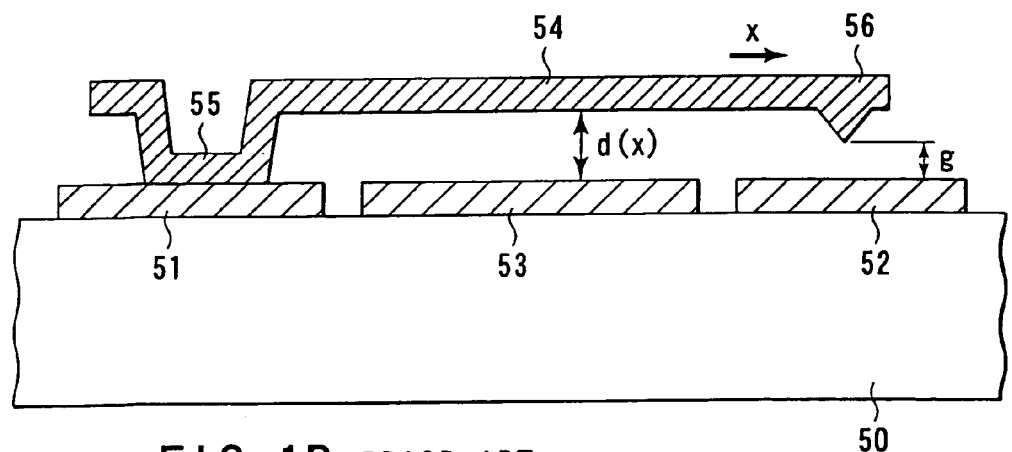
FIG. 1B is a sectional view taken along line 1B—1B of FIG. 1A.

With the conventional system in which one beam is displaced vertically as shown in FIGS. 1A and 1B, to obtain a low threshold value, some accommodation is required to make the contact-to-contact gap g smaller than the gap d(x) between the gate electrode and the beam. In contrast, in this embodiment, the gap d0 between the moving portion 11 and the driving electrode 14 can be made smaller than the gap g between the moving contacts 13 to obtain a low threshold characteristic owing to utilization of lateral displacement of the paired moving portions 11.

In this embodiment, the three beams 20 are placed symmetrically with respect to the central beam. Thus, a single-pole/double-throw relay can be implemented using the driving electrodes 14 on opposite sides of the central beam.

In addition, the contact area of the moving contacts 13 opposing to each other can be set freely by the thickness of the metal layer 22, which will ensure high reliability.

The steps of manufacture of the micro relay switch of this embodiment will be described with reference to FIGS. 8A and 8B through FIGS. 13A and 13B. In these figures, those whose numbers are attached with A correspond to sectional views taken along line A—A of FIG. 4 in the order of steps of manufacture and those whose numbers are attached with B correspond to sectional views taken along line B—B.

Figure 8A:
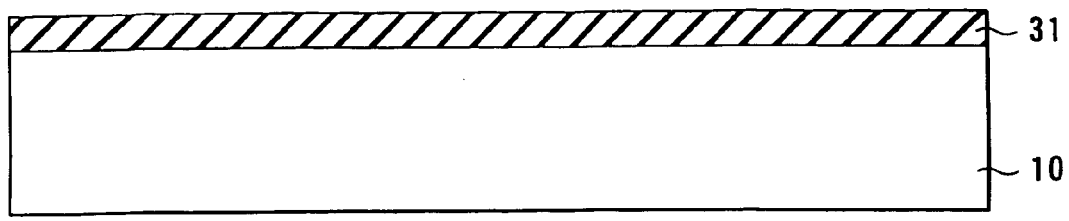
Figure 8B:
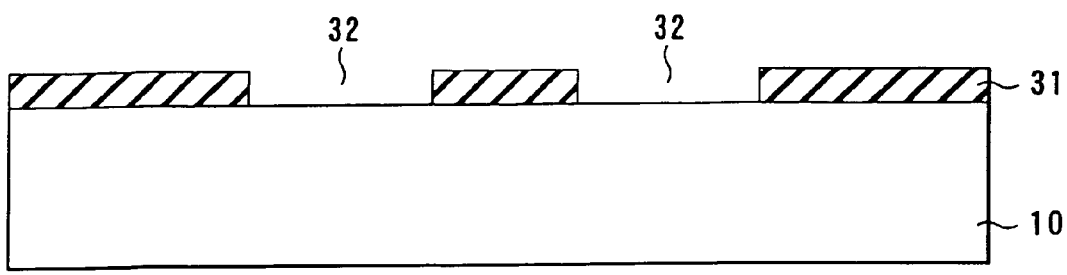

As shown in FIGS. 8A and 8B, a sacrificial layer 32 is deposited at a thickness of about 1 μm over the silicon substrate 10. Specifically, the sacrificial layer 31 is formed of an insulating layer of a material, such as silicon oxide or silicon nitride, which provides high etch selectivity to the beam material and the substrate 10. The sacrificial layer 10 is selectively etched to form openings 32 which expose portions of the substrate 10 where subsequently formed anchors and gate electrodes are to be fixed to the substrate.

Figure 9A:
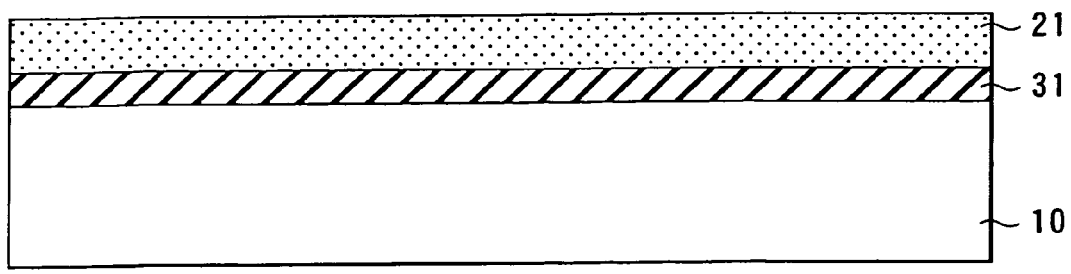
Figure 9B:
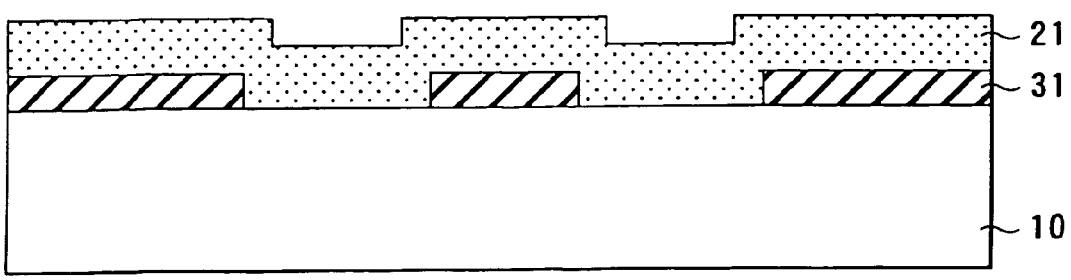
Figure 10A:
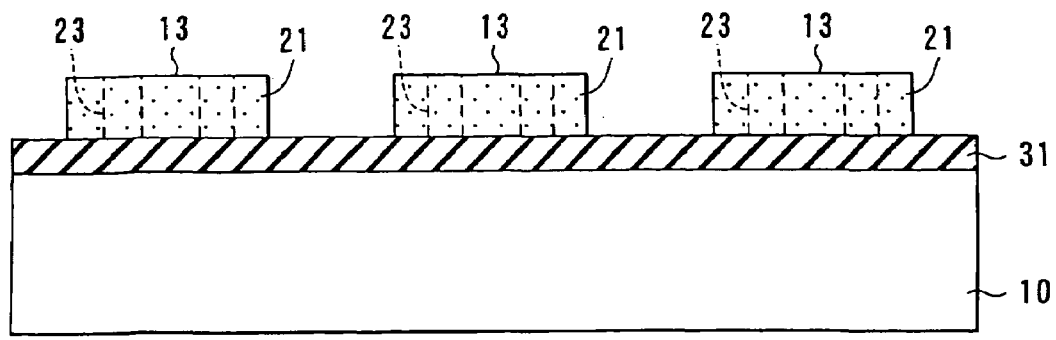
Figure 10B:
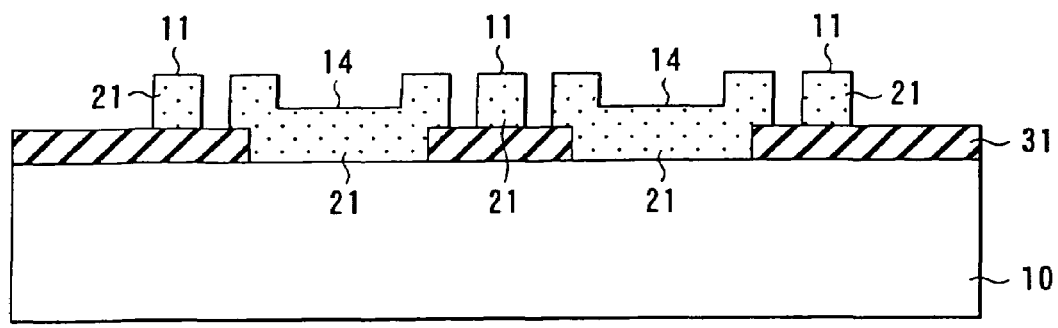

Next, as shown in FIGS. 9A and 9B, a layer 21 of polysilicon, which forms a base material of the switch member, is deposited at a thickness of about 1 μm. The polysilicon layer is then subjected to selective etching to form, as shown in FIGS. 10A and 10B, a crossbar comprising the moving portions 11, the moving contacts 13 and the anchor portions 12 (not shown in FIGS. 10A and 10B), corresponding portions of which being made integral with one another, and the isolated driving electrodes 14. At the same time, some openings 23 are formed in each of portions corresponding to the moving contacts 13 for subsequent etching of the sacrificial layer 31.

Figure 11A:
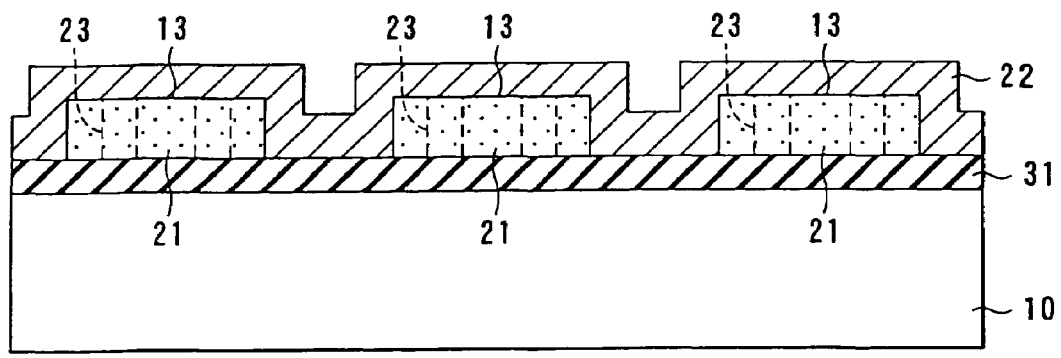
Figure 11B:
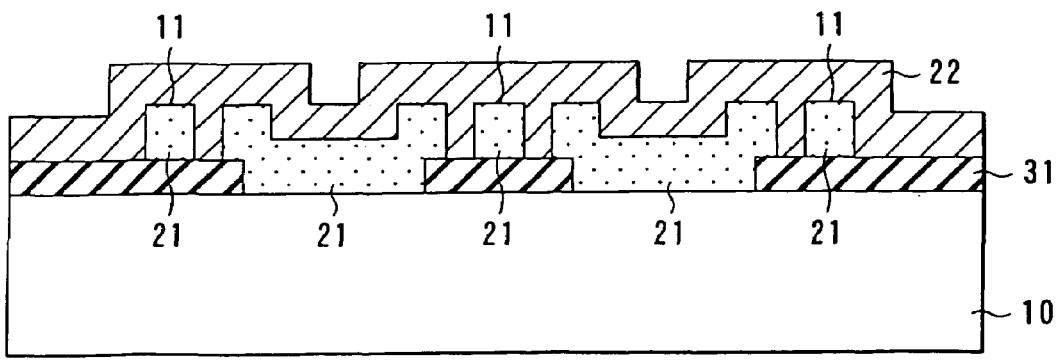
Figure 12A:
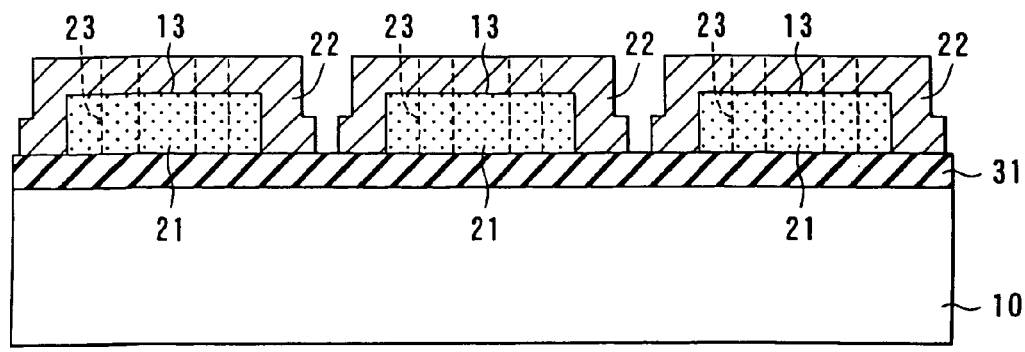
Figure 12B:
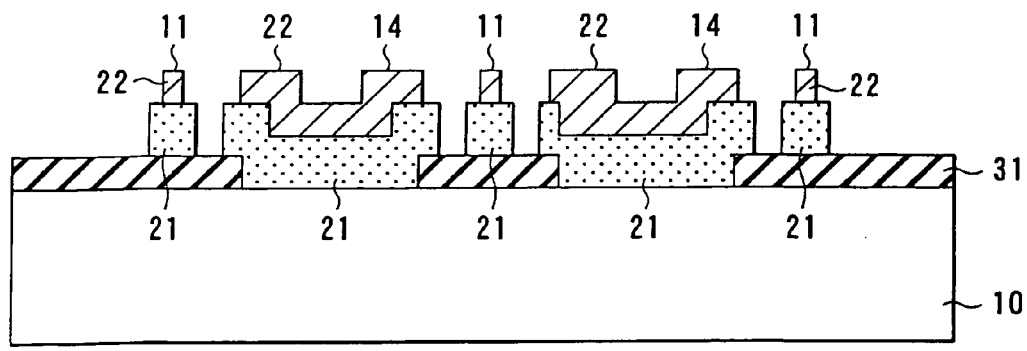
Figure 13A:
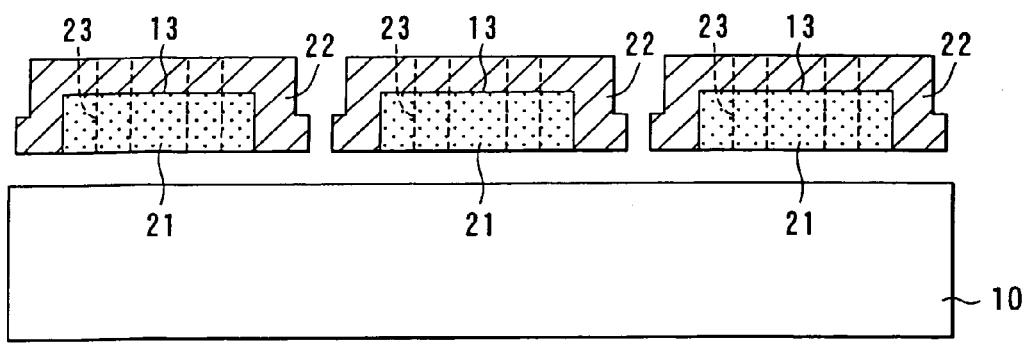
Figure 13B:
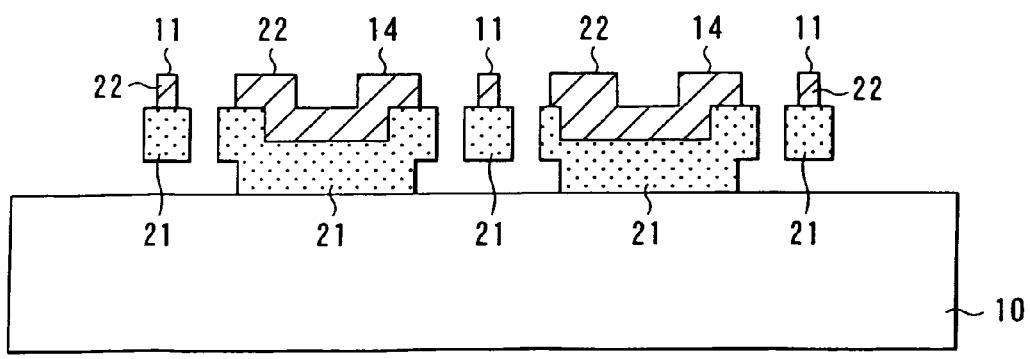

Next, as shown in FIGS. 11A and 11B, a metal layer 22 is deposited at a thickness of about 1 µm over the entire surface. The metal layer 22 is then selectively etched in substantially the same pattern as the polysilicon layer (crossbar) 21 as shown in FIGS. 12A and 12B, thereby forming the beams 11, the anchors 12, the moving contacts 13, and the driving electrodes 14 as the stacked metal/polysilicon structure. As for the moving contacts 13, the metal layer 22 is patterned so as to protrude laterally from the edge of the polysilicon layer 21. This is intended to make small the gap between the adjacent moving contacts 13. The moving contacts 13 are patterned and formed with openings that communicate with the openings 23 formed in the underlying polysilicon layer 21.

In the above steps of manufacture, a metal compound layer, such as a titanium silicide layer or titanium nitride layer, may be used instead of the metal layer. Further, the openings formed through the metal layer 22 and the polysilicon layer 21 may be formed simultaneously after forming the metal layer 22 over the polysilicon layer 21.

Finally, the sacrificial layer 31 is etched away with the result that the moving portions 11 and the moving contacts 13 are allowed to float above the substrate 10. Although the moving contacts 13 are formed wider than the moving portions 11, the sacrificial layer 31 underlying the moving contacts 13 is etched not only from peripheral portions but through the holes 23. Thus, the sacrificial layer 31 can be removed in a relatively short time.

In this embodiment, the following three lithographic steps are involved:

(1) Patterning of the sacrificial layer 31 (FIGS. 8A and 8B)

(2) Patterning of the polysilicon layer 21 (FIGS. 10A and 10B)

(3) Patterning of the metal layer 22 (FIGS. 12A and 12B)

In comparison with the conventional system that uses two conductor layers, therefore, the embodiment allows the manufacturing process to be simplified. According to this embodiment, the gap between contacts and the gap between beams do not depend on the thickness of the sacrificial layer and the amount of etching but is determined by the accuracy of lithography, allowing small gaps to be obtained with high accuracy. As a result, a relay switch with a low threshold voltage can be implemented.

Figure 14:
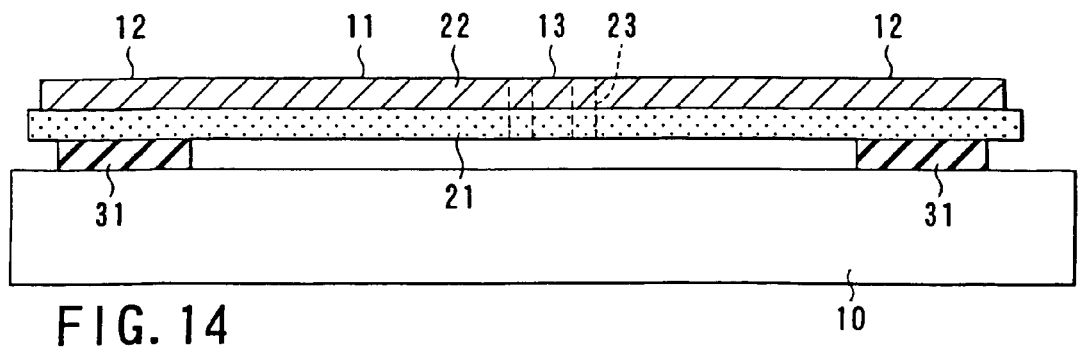
FIG. 14 is a sectional view of a micro relay according to a modification of the first embodiment.

In the above embodiment, the anchors 12 and the driving electrodes 14 are fixed to the substrate 10 after the sacrificial layer 31 has been removed. In contrast, it is also possible to allow the anchors 12 and the driving electrodes 14 to be fixed to the substrate 10 with the sacrificial layer 31 interposed therebetween. This state will be as depicted in FIG. 14, which is a sectional view corresponding to FIG. 7.

By increasing the area of the anchor portions 12, the sacrificial layer 31 underlying the anchor portions is allowed to remain even if the sacrificial layer underlying the moving portions 11 is etched away. Likewise, the portions of the driving electrodes 14 are allowed to be fixed to the substrate 10 with the sacrificial layer interposed therebetween. Although the moving contacts 13 are also large in area, the underlying sacrificial layer 31 can be removed thoroughly owing to the presence of the etching holes 23.

Thus, the manufacturing process requires one-step fewer lithographic steps and hence becomes further simplified.

As described above, in the first embodiment, the anchor portions 12 and the driving electrode portions 14 are fixed to the substrate with the underlying sacrificial layer 31 removed. In this case, it is also possible to remove the underlying sacrificial layer only by etching from directions along the substrate surface without forming the openings 23 in the moving contact portions 13 if a sufficient etching time is ensured under the condition of a high etch selectivity between the sacrificial layer and other material portions. However, when the anchor portions 12 and the driving electrode portions 14 are fixed to the substrate with the underlying sacrificial layer 31 left and the moving contacts 13 are comparable in area to the anchor portions 13 or the driving electrodes 14, it is essential to form the openings 23 in order to remove the sacrificial layer 31 underlying the moving contacts 13.

SECOND EMBODIMENT

Figure 3:
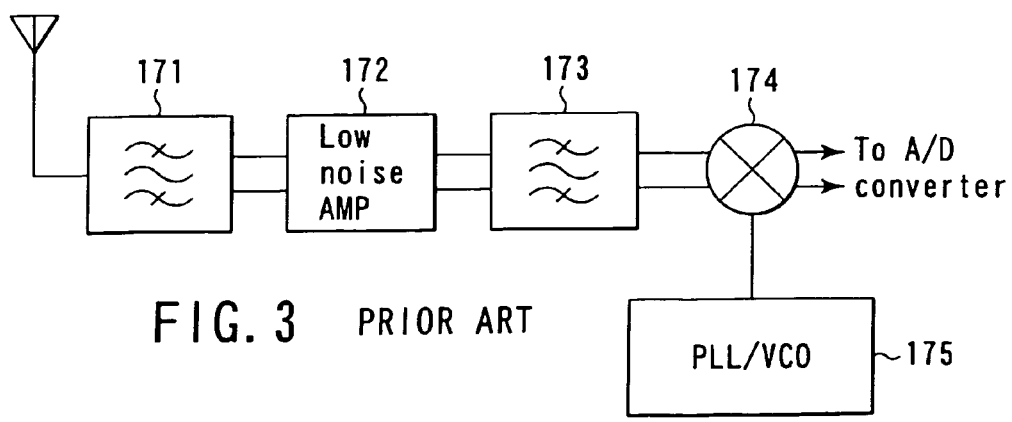
FIG. 3 shows a configuration of a general high-frequency receiver.
Figure 15:
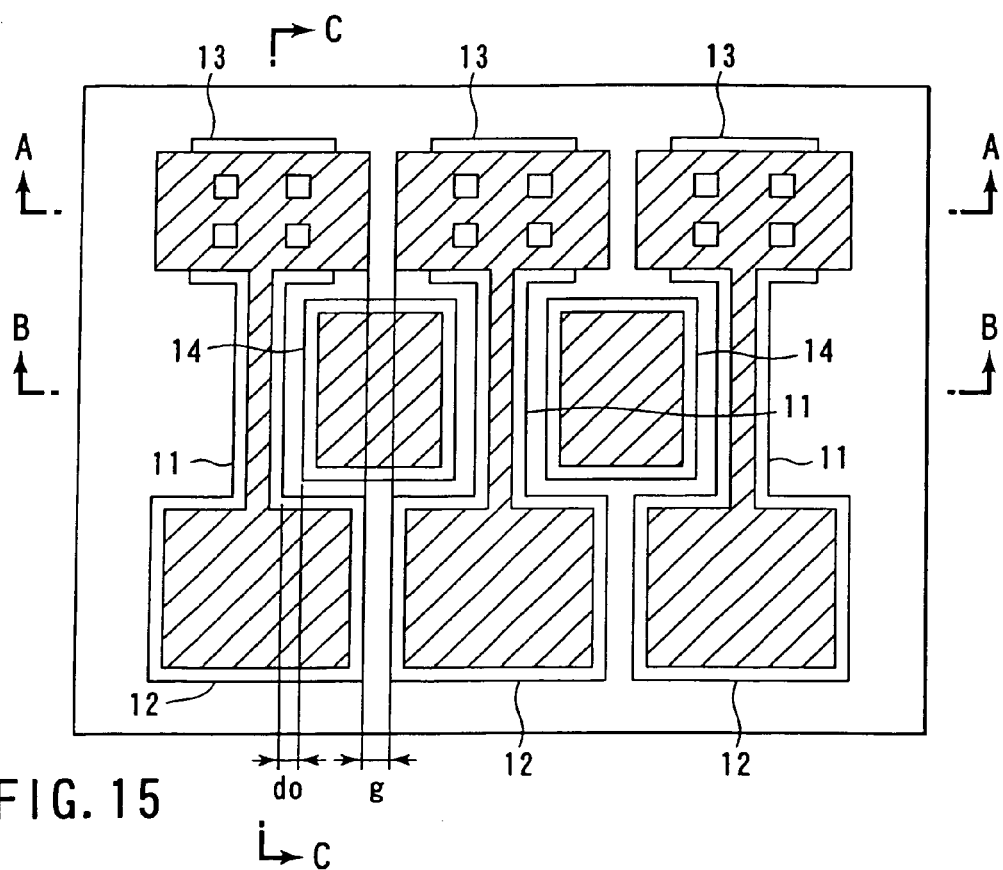
FIG. 15 is a plan view of a micro relay according to the second embodiment.
Figure 16:
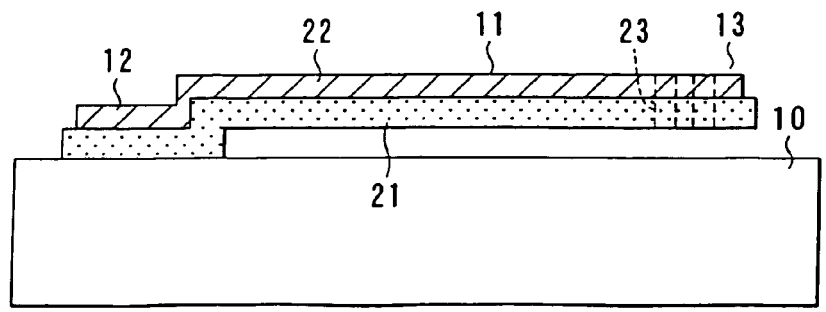
FIG. 16 is a sectional view taken along line C—C of FIG. 15.

Although, in the first embodiment, the beams are fixed at both ends, they may be of a cantilever type in which only one end is fixed to the corresponding anchor portion. Such an embodiment is illustrated, in plan view, in FIG. 15, which corresponds to FIG. 3. In this figure, parts corresponding to those in the first embodiment are denoted by like reference numerals. Sectional views taken along lines A—A and B—B of FIG. 15 remain unchanged from FIGS. 5 and 6. The section taken along line C—C of FIG. 15 is as depicted in FIG. 16. As shown, the moving contacts 13 are made open.

Such a cantilever-type configuration allows the device area to be reduced in comparison with the first embodiment.

THIRD EMBODIMENT

Figure 17A:
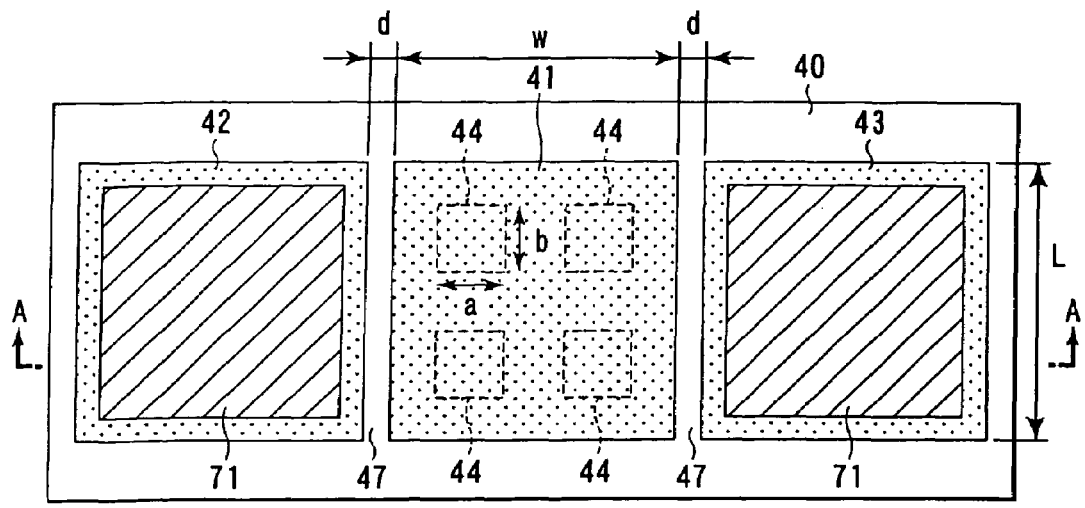
FIG. 17A is a plan view of a vibrator filter according to the third embodiment.
Figure 17B:
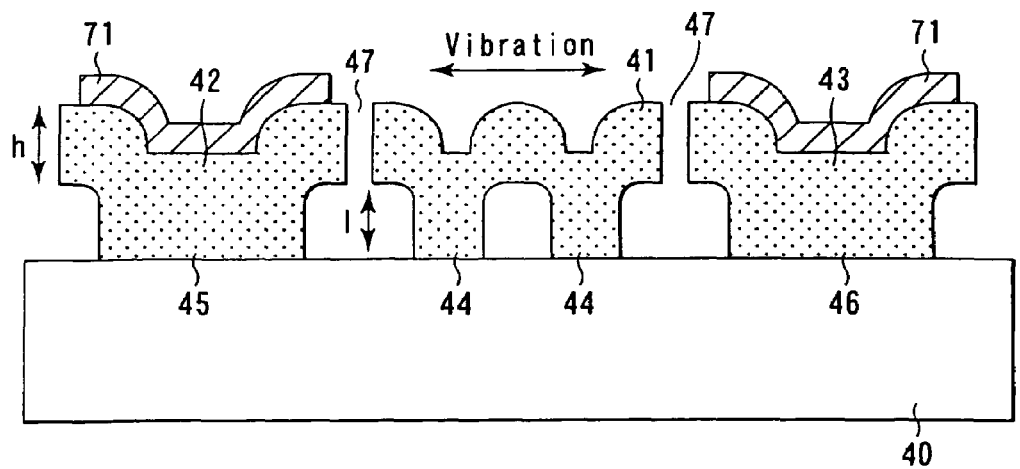
FIG. 17B is a sectional view taken along line A—A of FIG. 17A.

The third embodiment is directed to an application of the present invention to a micromechanical vibrator filter. As shown in FIGS. 17A and 17B, the micro-mechanical vibrator filter of this embodiment is a unit vibrator filter, which comprises a silicon substrate 40, a vibrator 41 obtained by forming a polysilicon layer deposited on the substrate into a rectangular pattern, an input terminal electrode 42, and an output terminal electrode 43. A practical mechanical filter is configured to have a predetermined passband by arraying a plurality of such unit vibrator filters.

The vibrator 41 is placed between the input terminal electrode. 42 and the output terminal electrode 43 and fixed to the substrate 40 by pillars 44 at one or more points (four points in this example). The deflection of the pillars 44 allows displacement of the vibrator 44 in directions parallel to the substrate. The input and output terminal electrodes 42 and 43 are fixed to the substrate 40 in fixing portions 45 and 46, respectively, which have a large area.

The opposite sides of the vibrator 41 face the sides of the input and output terminal electrodes 42 and 43 with a small gap 47 therebetween. Application of voltage to the input terminal electrode 42 causes electrostatic force to act on the vibrator 41, allowing it to vibrate laterally. The vibrator 41 has an inherent vibrating frequency (resonant frequency) determined by the spring constant of the pillars 44 and the mass of the vibrator body on the pillars. Therefore, if, when an alternating voltage is applied to the input terminal electrode 42, the frequency of the input alternating voltage coincides with the inherent vibrating frequency of the vibrator, then resonance will occur and a voltage opposite in phase to the input voltage will appear at the output terminal electrode 43, thus performing a filter function.

Specifically, the spring constant k is represented by $$k=4Ea^3b/l^3$$

where a and b are the lengths of the sides of each pillar and l is the height of the pillar.

The resonant frequency $f_0$ is represented by $$f_0=(1/\pi)(Ea^3b/\rho Lwhl^3)^{1/2}$$

where L, w, h and ρ are the length, width, height and density, respectively, of the vibrator. In a typical case with L=4 μm, w=4 μm, h=1 μm, l=0.75 μm and a=b=1 μm, $f_0$=1.05 GHz.

Figure 2A:
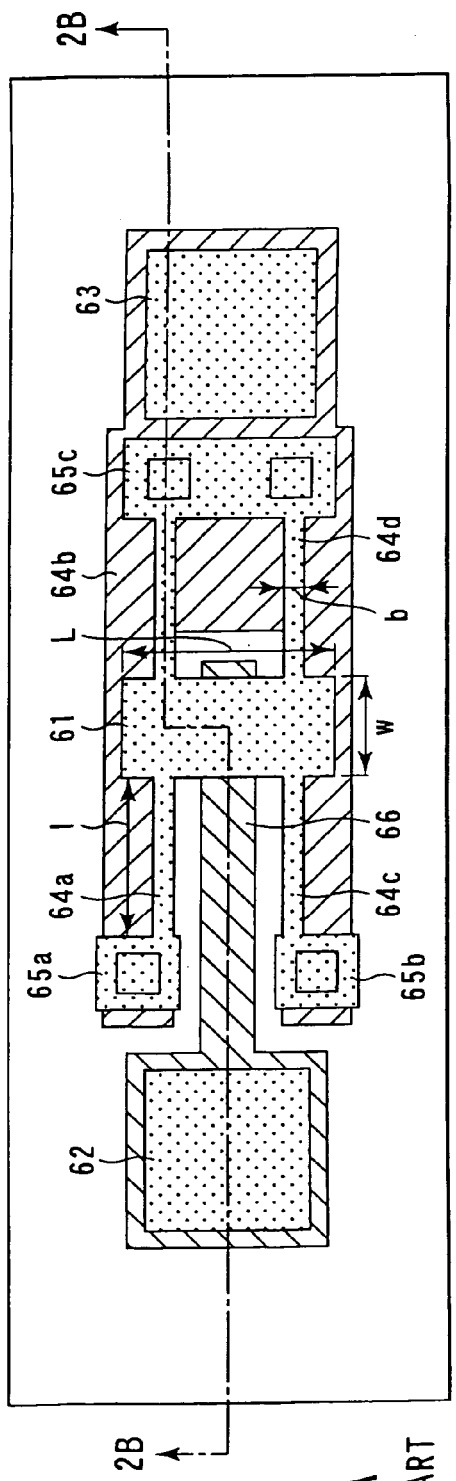
FIG. 2A is a plan view of a conventional vibrator filter.
Figure 2B:
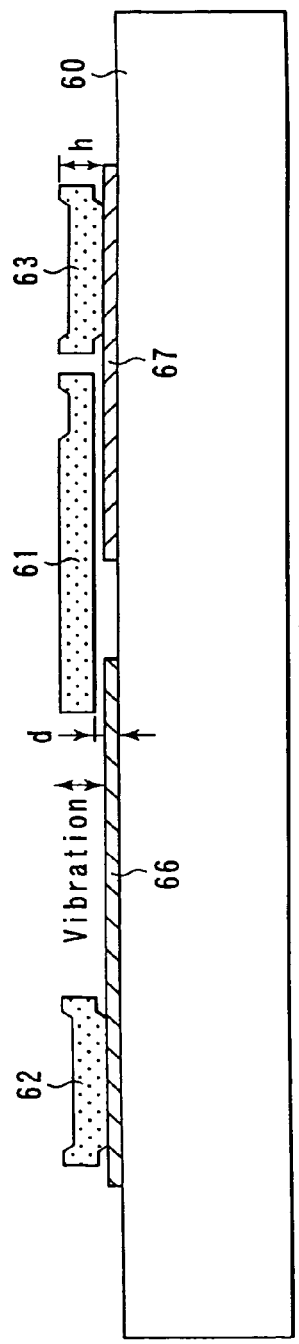
FIG. 2B is a sectional view taken along line 2B—2B of FIG. 2A.
Figure 4:
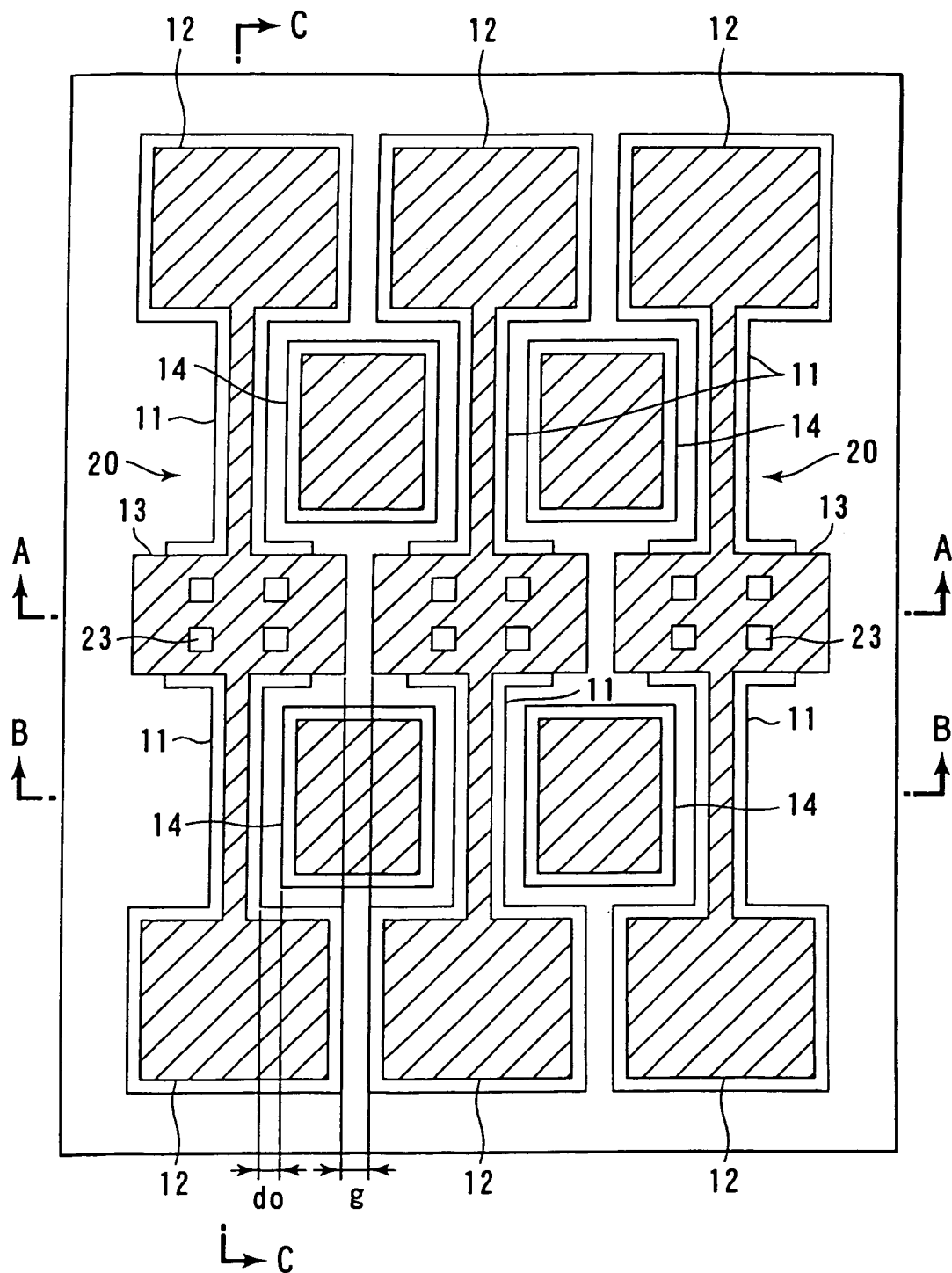
FIG. 4 is a plan view of a micro relay according to the first embodiment.
Figure 5:
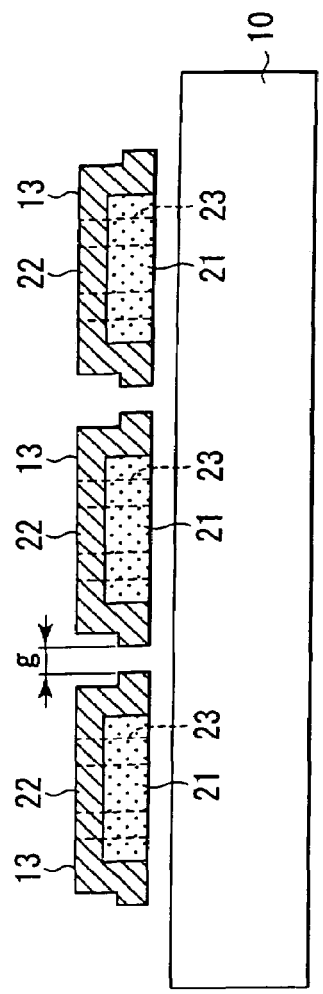
FIG. 5 is a sectional view taken along line A—A of FIG. 4.
Figure 6:
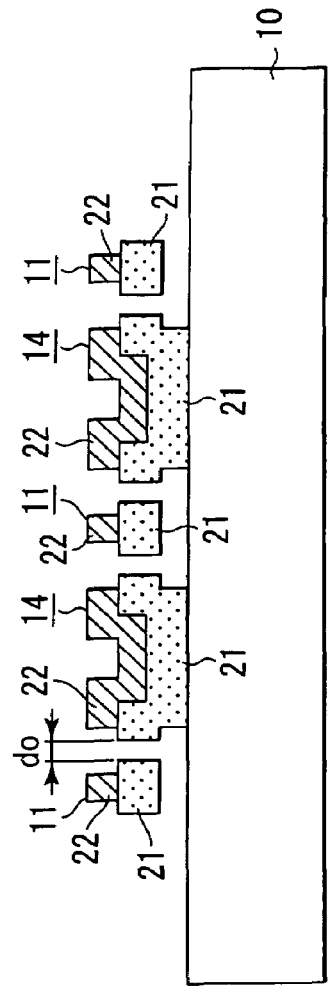
FIG. 6 is a sectional view taken along line B—B of FIG. 4.
Figure 7:
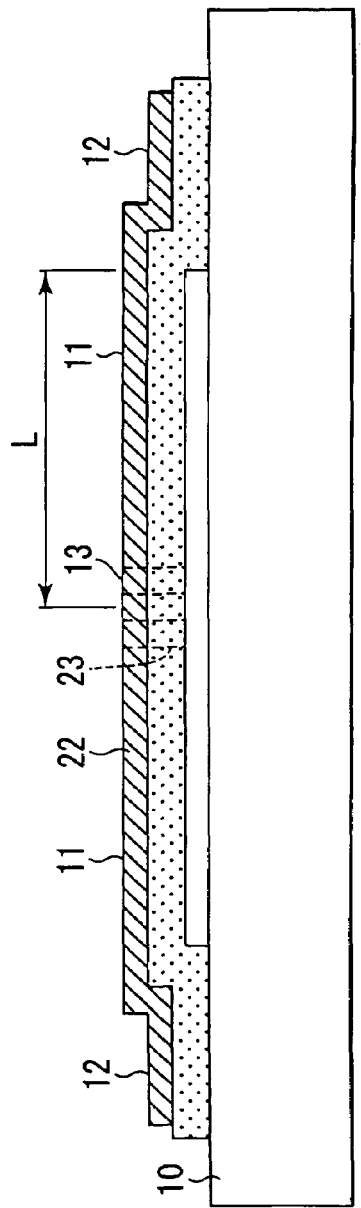
FIG. 7 is a sectional view taken along line C—C of FIG. 4.

One of the reasons why the system of this embodiment is easily adapted for high-frequency operation in comparison with the conventional system shown in FIGS. 2A and 2B is that the way in which the thickness h of the vibrator is related to the resonant frequency $f_0$ differs. That is, in the conventional system, the resonant frequency $f_0$ is proportional to the thickness h of the vibrator. Consider the case of increasing the resonant frequency by a factor of ten with the vibrator thickness alone. In this case, it would be required to increase the thickness, for example, from 10 μm to 100 μm. This involves difficulties. In contrast, with this embodiment, the resonant frequency $f_0$ is in inverse proportion to $l^{3/2}$ and $h^{1/2}$. It is easy to decrease the thickness h of the vibrator. The other two-dimensional dimensions to determine the resonant frequency can be selected within the processing range of the normal semiconductor process as in the above example. It is therefore easy to adapt the micromechanical device for high-frequency operation.

Accordingly, this embodiment allows high-frequency filters useful for portable terminals to be compacted.

Figure 18A:
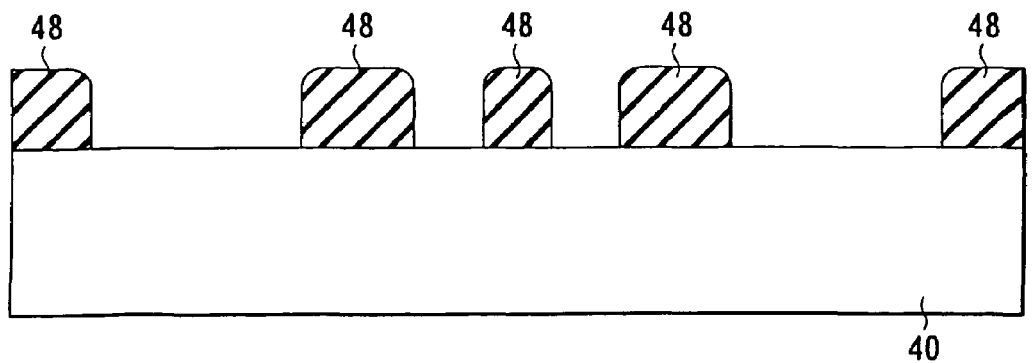
FIGS. 18A, 18B and 18C are sectional views, in the order of steps of manufacture, of the vibrator filter of FIG. 17A.
Figure 18B:
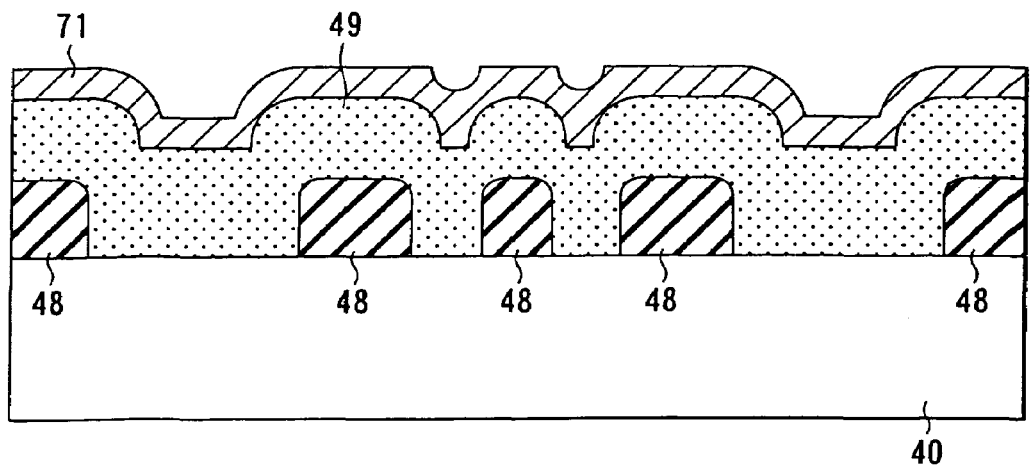

The manufacturing steps of the filter of this embodiment will be described with reference to FIGS. 18A, 18B and 18C. As shown in FIG. 18A, a sacrificial layer 48 is deposited over the surface of a silicon substrate 40. The sacrificial layer is then patterned to form openings in areas where the input and output terminal electrodes 42 and 43 and the pillars of the vibrator 41 are to be fixed to the substrate. As shown in FIG. 18B, a polysilicon layer 49 and an electrode layer 71 are deposited in turn over the resulting structure.

Figure 18C:
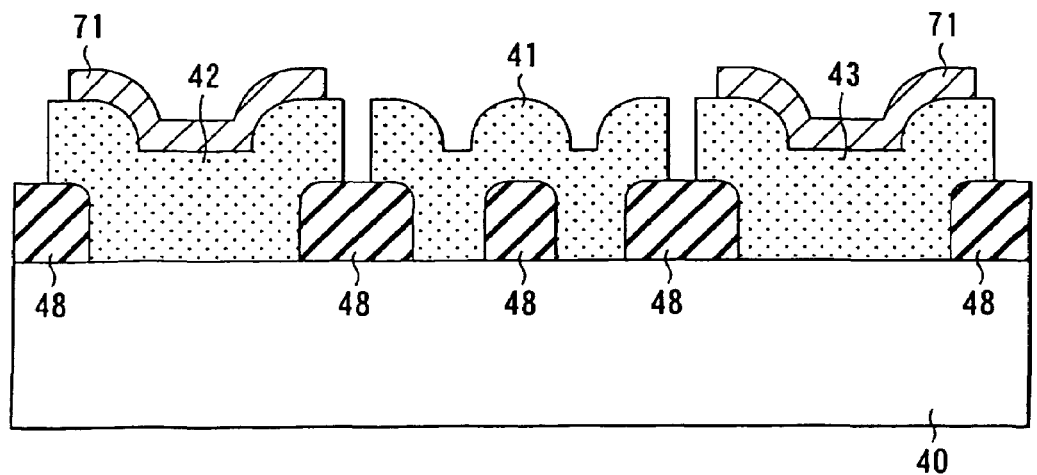

Next, as shown in FIG. 18C, the electrode layer 71 is patterned so that it is left on the input and output terminal portions only. Further, the polysilicon layer is patterned to form the input terminal electrode 42, the vibrator 41, and the output terminal electrode 43 separately. Finally, the sacrificial layer 48 is etched away.

This embodiment involves three lithographic steps: patterning of the sacrificial layer 48; the patterning of the electrode layer 71; and patterning of the polysilicon layer 49. Thus, the manufacturing steps are very simple. The aforementioned dimensions can be readily realized through the current semiconductor processing techniques.

The vibrator and the input and output terminal electrodes can be formed of suitable conductive material layer, which includes at least one material selected from the group consisting of polycrystalline silicon, monocrystalline silicon, metal, and metal compound.

As described above, according to this invention, a micromechanical device which ensures high performance with simple structure and process can be obtained by forming the moving parts, such as the switch contacts and the vibrator, so that they are capable of lateral displacement.

FOURTH EMBODIMENT

The merit of microelectromechanical systems (MEMS) is that mechanical parts and control circuits can be integrated on a semiconductor substrate. In conventional micromechanical devices, as shown in FIGS. 1A and 1B a sacrificial layer, such as an oxide layer, is etched away to form and utilize a gap the width of which corresponds to the thickness of the sacrificial layer. In order to drive a conductor beam with electrostatic force, it is required to apply a driving voltage in the direction of layer thickness. Since a drive circuit is formed on the substrate, the conductor beam must be formed in an area separate from the drive circuit on the substrate.

In contrast, the feature of the micromechanical device of the present embodiments is that the moving parts (beams) displace in a horizontal direction with respect to the substrate surface. Since usual ICs comprise lateral devices, it becomes possible to place an output element just below a moving part (beam). This allows the chip area to be reduced significantly and the number of interconnects to be reduced. In the fourth embodiment, the micromechanical switch of the first embodiment and MOSFETs are formed on the same semiconductor substrate.

Figure 19:
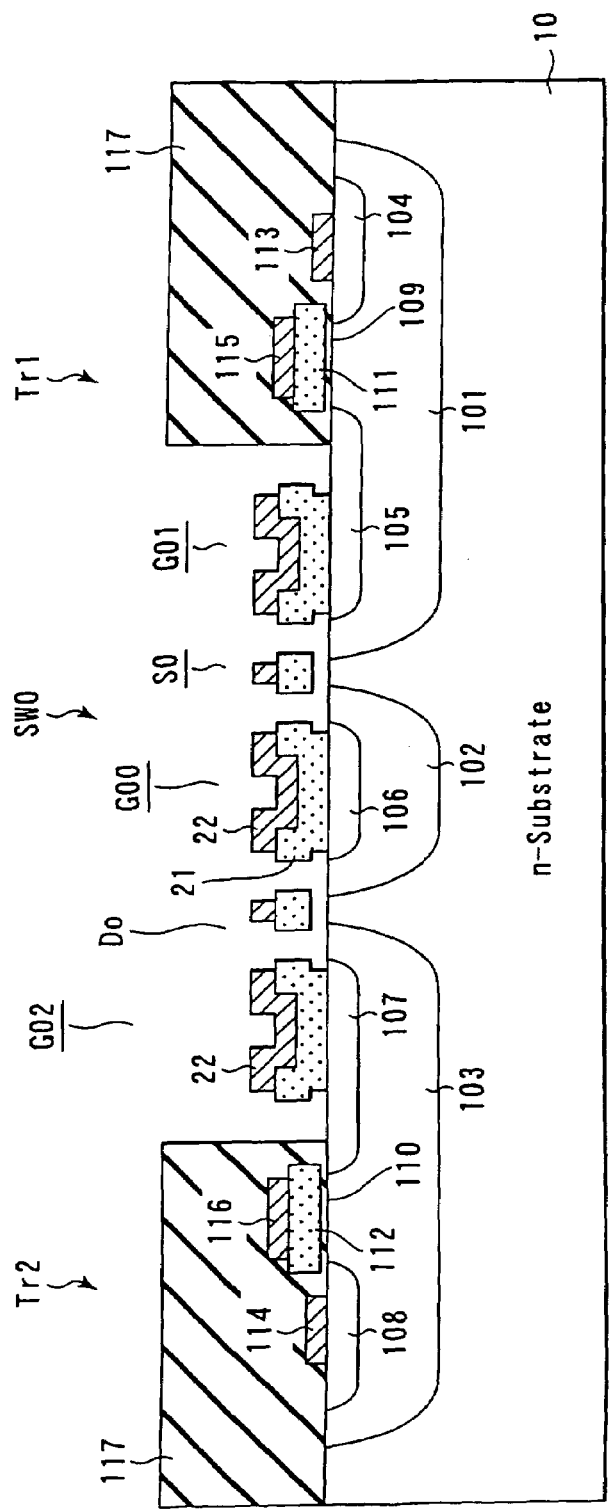
FIG. 19 is a sectional view of a micromechanical device according to the fourth embodiment.
Figure 20:
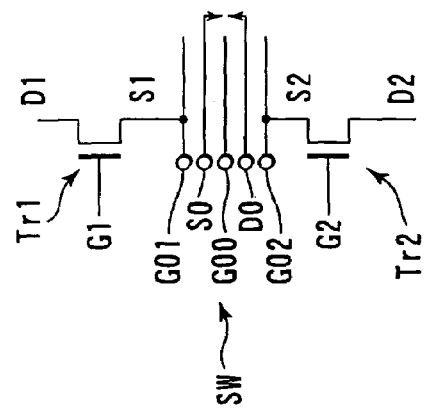
FIG. 20 shows a schematic equivalent circuit of the micromechanical device of FIG. 19.

In a microelectromechanical device of the fourth embodiment, a single-pole/single-throw switch is driven by two MOSFETs as shown in FIG. 19. FIG. 20 shows a schematic equivalent circuit of the device.

More specifically, p-type wells 101, 102 and 103 are formed in an n-type semiconductor substrate 10. In the p-type well 101, a drain layer 104 (D1) and a source layer 105 (S1) are formed. A gate electrode 111, in the form of polysilicon, is formed over a portion of the p-type well 101 between the source and drain layers with a gate insulating film 109 interposed therebetween. Metal interconnections 115 and 113 are formed on the gate electrode 111 and the drain layer 104, respectively, thus forming a first MOSFET (Tr1) The first MOSFET is covered with an interlayer insulating film 117 with a portion of the source layer 105 exposed.

In the p-type well 103 as well, a second MOSFET (Tr2) is likewise formed, which comprises source/drain layers 107 and 108 and a gate electrode 112 formed on a gate insulating film 110. Metal interconnections 116 and 114 are formed on the gate electrode 112 and the drain layer 108, respectively. The second MOSFET is also covered with the interlayer insulating film 117 with a portion of the source layer 107 exposed.

The microelectromechanical switch (SW0) of the first embodiment is formed on that portion of the surface of the semiconductor substrate 10 which is not covered with the interlayer insulating film 117. In FIG. 19, the switch SW0 is illustrated in correspondence with the sectional view taken along line B—B of FIG. 4. That is, on an n-type layer 106 formed in the p-type well 102 is formed a gate electrode G00 which is comprised of a polysilicon layer 21 and a metal layer 22. The n-type layer 106 is connected to a drive transistor not shown. Other gate electrodes G01 and G02 of the switch SW0 are formed on the source layers 105 and 107, respectively, of the first and second MOSFETs. A source electrode S0 and a drain electrode D0 are formed between the gate electrodes G00 and G01 and between the gate electrodes G00 and G02, respectively.

In operation, when a positive potential higher than the threshold voltage is applied to the gate electrode G00 and ground potential is applied to the gate electrodes G01 and G02 from the driver transistors Tr1 and Tr2, the source electrode S0 and the drain electrode D0 are attracted to the gate electrode G00, resulting in short-circuiting thereof.

Next, the method of manufacture of the above device will be described briefly. The p-type wells 101, 102 and 103 are formed in the n-type semiconductor substrate 10. The gate electrodes 111 and 112 are formed above the p-type wells 101 and 103 with the gate insulating films 109 and 110 interposed therebetween. Using the gate electrodes 111 and 112 and a selectively formed resist layer (not shown) as a mask, the n-type layers 104 through 108 are formed. Metal interconnections or electrodes are formed on the gate electrodes 111 and 112 and the drain layers 104 and 108 and then the interlayer insulating film 117 is formed over the entire surface.

Next, the interlayer insulating film 117 is selectively etched to expose an area of the substrate surface where the switch SW0 is to be formed. The gate electrodes G00, G01 and G02, the source electrode S0 and the drain electrode D0 are formed in this exposed area according to the method described in connection with the first embodiment. The interlayer insulating film 117 that protects transistors and the sacrificial oxide film (31 in FIG. 8A) of the switch are preferably formed of materials for which high etch selectivity can be taken, for example, silicon nitride and silicon oxide.

When the interlayer insulating film 117 and the sacrificial oxide film 31 are made of the same material, the interlayer insulating film 117 may be dry-etched to expose the switch formation region, while the sacrificial oxide film 31 is wet-etched. In this case, it is needed that a distance from the gate electrode 111 or 112 to the nearest edge of the dry-etched opening be sufficiently longer than a side-etch length of wet etching.

The microelectromechanical device configured as described above allows the chip area to be reduced significantly and the number of interconnections to be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a micromechanical switch comprising:

forming a sacrificial layer over a surface of a substrate;

forming a polysilicon layer on the sacrificial layer;

selectively etching the polysilicon layer to form a pair of beam members placed in proximity to each other and a driving electrode placed between the beam members, each of the beam members having a fixing portion configured to fix at least one end thereof to the substrate and a moving portion extending from the fixing portion;

forming a metal or metal compound layer so as to cover the beam members and the driving electrode;

selectively etching the metal or metal compound layer so that the metal or metal compound layer is left on the beam members and the driving electrode; and etching away the sacrificial layer existing at least under the moving portion of each of the beam members.

2. The method according to claim 1, wherein the forming of the beam members and the driving electrode includes forming at least one opening in a portion of each of the beam members which reaches the sacrificial layer.

3. The method according to claim 1, between the etching of the metal or metal compound layer and the etching away of the sacrificial layer, further comprising etching the metal or metal compound layer and the beam members to form at least one opening reaching the sacrificial layer.

4. The method according to claim 1, wherein the etching away of the sacrificial layer includes etching the sacrificial layer under the moving portions through the at least one opening formed in the metal or metal compound layer and the beam members.

5. A method of manufacturing a vibrator filter comprising:

forming a sacrificial layer over a surface of a substrate to have a first, a second and a third opening;

depositing a conductor layer on the sacrificial layer;

patterning the conductor layer to form an input terminal electrode, an output terminal electrode, and a vibrator having a moving portion with at least two side faces and a pillar, the input terminal electrode and the output terminal electrode being placed with a predetermined spacing therebetween and fixed to the substrate through the first and the second opening, and the vibrator being placed between the input terminal electrode and the output terminal electrode so that one of the side faces of the moving portion is opposed to a side of the input terminal electrode and another of the side face is opposed to a side of the output terminal electrode, with a small gap respectively, and is held above the substrate by the pillar formed in the third opening; and removing the sacrificial layer.

6. The method according to claim 5, the depositing a conductive layer includes depositing at least one material selected from the group consisting of polysilicon, metal and metal compound.

7. The method according to claim 5, the patterning the conductive layer includes patterning the input terminal electrode, the output terminal electrode and the moving portion in a shape of rectangle.

8. The method according to claim 5, wherein the pillar is formed of a plurality of sub-pillars.

* * * * *